United States Patent
Auvray

Patent Number: 5,953,641
Date of Patent: Sep. 14, 1999

[54] MULTIMODE RADIO COMMUNICATION TERMINAL

[75] Inventor: Gérard Auvray, Bezons, France

[73] Assignee: Alcatel Mobile Phones, Paris, France

[21] Appl. No.: 08/777,733

[22] Filed: Dec. 20, 1996

[30] Foreign Application Priority Data

Dec. 22, 1995 [FR] France .................................. 95 15396

[51] Int. Cl.⁶ .................................................. H04B 1/40
[52] U.S. Cl. ........................... 455/74; 455/86; 455/208; 455/260; 455/553
[58] Field of Search .................................. 455/552, 553, 455/74, 75, 76, 84, 85, 86, 87, 208, 259, 260, 264, 256, 314, 318, 323, 326; 375/298

[56] References Cited

U.S. PATENT DOCUMENTS

| 4,259,644 | 3/1981 | Iimura | 455/260 |
|---|---|---|---|
| 5,319,799 | 6/1994 | Morita | 455/86 |
| 5,519,885 | 5/1996 | Vaisanen | 455/76 |
| 5,564,076 | 10/1996 | Auvray | 455/76 |
| 5,606,736 | 2/1997 | Hasler et al. | 455/260 |
| 5,610,559 | 3/1997 | Dent | 455/76 |
| 5,732,330 | 3/1998 | Anderson et al. | 455/86 |
| 5,734,970 | 3/1998 | Saito | 455/87 |

FOREIGN PATENT DOCUMENTS

2258776 2/1993 United Kingdom .
WO8907865 8/1989 WIPO .

OTHER PUBLICATIONS

Weger et al, "Completely Intergrated 1.5GHz Direct Conversion Transceiver", *1994 Symposium on VLSI Circuits*, Jun. 9, 1994, Honolulu, pp. 135–137.

*Primary Examiner*—Nguyen Vo
*Assistant Examiner*—Lester G. Kincaid
*Attorney, Agent, or Firm*—Sughrue, Mion, Zinn, Macpeak & Seas, PLLC

[57] ABSTRACT

A multimode radio communication terminal includes a tunable source of transmit and/or receive local oscillator signals for transmitting and/or receiving channels of different frequency bands in at least two radio communication systems. The terminal includes, downstream of the tunable source, a switchable frequency changer implementing a fixed frequency change and selectively insertable so that, the source responding directly to the requirements of one radio communication system, insertion of the frequency changer renders it capable of responding to the requirements of another radio communication system using different frequency bands. This is achieved by virtue of a particular change to the frequency produced by the tunable source, effected by the frequency changer.

6 Claims, 1 Drawing Sheet

MULTIMODE RADIO COMMUNICATION TERMINAL

BACKGROUND OF THE INVENTION

1. Field of the Invention

The present invention concerns digital radio communications and, more particularly, a multimode radio communication terminal able to operate in at least two different radio communication systems using relatively close frequency bands, i.e. frequency bands that can be processed by the same technological means.

2. Description of the Prior Art

The invention may be applied in a dual mode GSM/DECT terminal, for example. The GSM system uses the frequency bands 890–916 MHz and 935–960 MHz for the two transmission directions and the DECT system uses the frequency band 1880–1900 MHz.

In the transmitter of a radio communication terminal a local oscillator produces a signal at the frequency of a transmit channel. In the receiver of a radio communication terminal the local oscillator produces a signal at the frequency of a receive channel. The signal at the transmit channel frequency, or transmit local oscillator signal, is modulated by the signal to be transmitted to produce a transmit signal. The signal at the receive channel frequency, or receive local oscillator frequency, is used to demodulate a receive signal carrying the information to be received. In the case of direct demodulation the receive local oscillator signal is combined vectorially with the receive signal picked up by the antenna to obtain a baseband information signal.

In different calls a terminal must be tuned to transmit and receive channels that are each different each time, depending on the local availability of the system in which it is used. The transmit and receive local oscillator signals are therefore provided by at least one source that can be tuned to the channels of the system. Since, in the digital radio communication systems discussed here, transmission takes place in a temporal frame with transmission and reception separated in time, a single tunable source is sufficient.

In the case of a dual mode terminal, although the conventional solutions require either a single tunable source with a much greater bandwidth or two separate tunable sources, one for each radio communication system, using a single tunable source of limited bandwidth has already been considered, as described in patent document FR-A-93 07 775. The principle adopted is firstly to achieve concordance of the frequency bands of the two systems and then to tune the terminal to a transmit channel or a receive channel using a single tunable source the tuning frequency band of which is more or less that of one only of the systems.

However, this requires an additional intermediate demodulator system in the receiver converting the receive band of one of the systems for concordance with the receive band of the other system.

Accordingly, an object of the present invention is a multimode radio communication terminal including, as previously, a tunable source of transmit and/or receive local oscillator signals, for transmitting and/or receiving one of the channels of different frequency bands in at least two radio communication systems but that does not require any frequency band conversion beforehand.

SUMMARY OF THE INVENTION

In accordance with the invention, this object is achieved because said terminal includes, downstream of said tunable source, a switchable frequency changer implementing a fixed frequency change, selectively insertable so that, said source responding directly to the requirements of one radio communication system, insertion of said frequency changer renders it capable of responding to the requirements of another radio communication system using different frequency bands, by virtue of a particular change to the frequency produced by said tunable source effected by said frequency changer.

In one embodiment, said frequency changer divides the frequency of the tunable source by a particular factor. Said factor is 2, in particular in the case of a GSM/DECT dual mode terminal.

The outputs of the tunable source and of the frequency changer are advantageously each followed by a phase-shifter supplying two signals phase-shifted 90° for modulating/demodulating signals of two radio communication systems applying quadrature modulation.

Only two mixers are advantageously provided for modulating/demodulating signals of two radio communication systems, these mixers receiving the signals phase-shifted 90° from one or from the other of said two phase-shifters.

The various objects and features of the invention are described in detail in the following description of one embodiment of the invention given by way of non-limiting example with reference to the accompanying drawing.

BRIEF DESCRIPTION OF THE DRAWING

The accompanying drawing shows a dual mode terminal in accordance with the invention.

DETAILED DESCRIPTION OF THE PREFERRED EMBODIMENT

Figure 1:
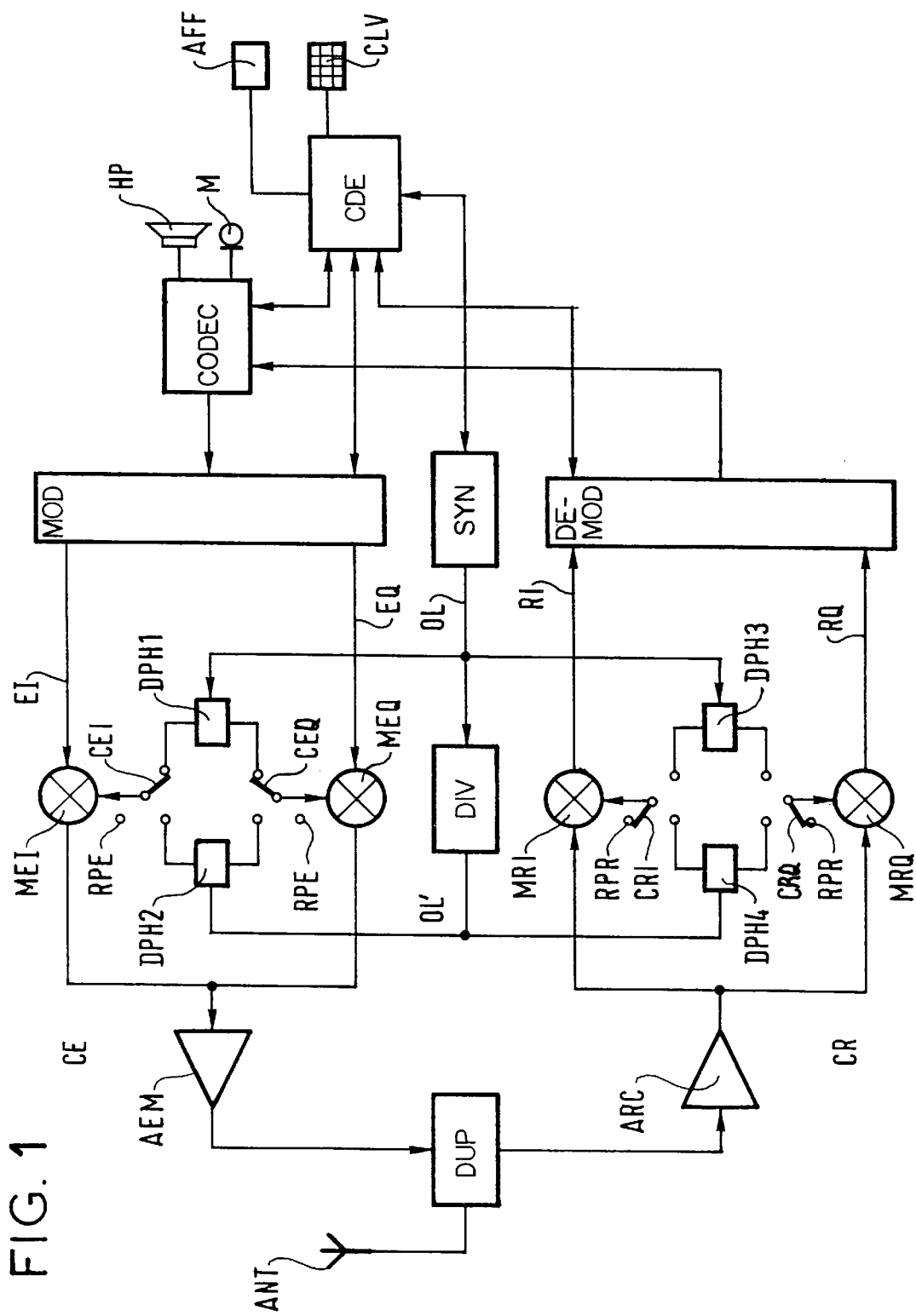

The dual mode terminal shown in simplified form in the figure includes a keypad CLV and a display AFF associated with a control device CDE enabling the user of the terminal to control the terminal to access one of at least two radio communication systems, for example the well-known GSM and DECT systems, and to exchange signals with those systems to obtain radio communications. The communications can be of varied forms. There are shown only a loudspeaker HP and a microphone M for voice communications associated with a speech coder/decoder CODEC connected to a modulator MOD and to a demodulator DEMOD.

The transmit part CE of the terminal includes, in addition to the modulator MOD having two outputs EI and EQ at which baseband signals to be transmitted are obtained, two transmit mixers MEI and MEQ the outputs of which are conjointly connected to a transmit amplifier AEM, the output of the latter driving an antenna ANT via a duplexer DUP.

The receive part CR of the terminal includes, connected to the antenna ANT and the duplexer DUP, a receive amplifier ARC and two receive mixers MRI and MRQ supplying baseband receive signals to inputs RI and RQ of the demodulator DEMOD.

In the transmitter part, the voice signals from the microphone M, digitally encoded in the coder/decoder CODEC, are converted to the transmission format in the modulator MOD which produces the signals to be transmitted in the form of successive transmit symbols each comprising two transmit unit signals respectively obtained at the outputs EI and EQ. In a first transmit mixer MEI the transmit unit signal EI conditions the amplitude of a 0° phase-shift transmit local oscillator signal. In a second transmit mixer MEQ the transmit unit signal EQ conditions the amplitude of a transmit local oscillator signal in phase quadrature with the previous signal. The addition of the two modulated transmit local oscillator signals at the input of the transmit amplifier AEM produces the radio signal to be transmitted (transmit signal).

In the receiver part, a received radio signal (receive signal), after amplification in the amplifier ARC, drives the receive mixers MRI and MRQ identically. In a first receive mixer MRI, the receive signal is combined with a 0° phase-shift receive local oscillator signal and this produces a receive unit signal at the input RI of the demodulator DEMOD. In a second receive mixer MRQ, the receive signal is combined with a receive local oscillator signal in phase quadrature with the preceding signal and this produces a receive unit signal at the input RQ of the demodulator DEMOD. The demodulator DEMOD recognizes the symbols that these unit signals constitute, demodulates them and supplies coded speech signals to the coder/decoder CODEC, which produces sound via the loudspeaker HP. The control device CDE is connected to the coder/decoder CODEC to obtain the received signals and to control its operation.

The above description is naturally highly schematic, but represents a technique that is well known in itself and is sufficient for an understanding of the present invention.

The user controls the terminal by means of the display AFF and the keypad CLV, operating on the control device CDE, where internal states generated periodically and automatically in the control device CDE are at certain times in a state for transmission to the DECT radio communication system. At this time, switches CEI, CEQ, CRI, CRQ commanded by the control device CDE over links that are not shown are in the positions shown in the figure. The control device CDE is connected to a tunable source SYN, for example a digital frequency synthesizer, and commands it to produce a transmit local oscillator signal of the DECT system. This local oscillator signal is provided at the output OL of the synthesizer SYN and drives a DECT transmit phase-shifter DPH1 which supplies to the first transmit mixer MEI, via a first transmit switch CEI in the position shown, a 0° phase-shift DECT transmit local oscillator signal and, to the second transmit mixer MEQ, via a second transmit switch CEQ in the position shown, a phase quadrature DECT transmit local oscillator signal. The signals to be transmitted thus modulate a DECT transmit local oscillator signal supplied directly by the tunable source SYN. Different commands from the control device CDE enable modulation of other DECT transmit local oscillator signals corresponding to other channels of the frequency band allocated to the DECT system. This frequency band extends from 1880 MHz through 1900 MHz.

In parallel with this, a bilateral link between the control device CDE and the modulator MOD, just like the bilateral link between the control device CDE and the coder/decoder CODEC, means that the encoding and the formatting of the signals to be transmitted conform to the rules of the DECT system.

Moreover, at the time just referred to, which is reserved for transmission, the terminal is not receiving. More generally, while the terminal is not receiving the receive part is disabled. One example of disabling means is shown by the receive switches CRI and CRQ being in the position RPR in which the two receive mixers MRI and MRQ do not receive any local oscillator signal.

At other times, and in particular those reserved for reception, the terminal does not transmit. The transmit part is then disabled. This is shown in a similar way by the fact that the transmit switches CEI and CEQ are in an additional position RPE in which the two transmit mixers MEI and MEQ do not receive any local oscillator signal.

When, in the DECT system, the terminal is to receive, the receive switches CRI and CRQ are set by the control device CDE in a position such that they connect the receive mixers MRI and MRQ to a DECT receive phase-shifter DPH3 which receives a DECT receive local oscillator signal generated in the synthesizer SYN under the control of the control device CDE; it sends to the first receive mixer MRI, via the first receive switch CRI, a 0° phase-shift DECT receive local oscillator signal; it sends to the second receive mixer MRQ, via the second receive switch CRQ, a DECT receive local oscillator signal in phase quadrature. Thus the receive mixers MRI and MRQ can send the baseband receive unit signals RI and RQ to the demodulator DEMOD. The latter, connected by a control link to the control device CDE, supplies encoded signals to the coder/decoder CODEC which converts them to voice signals output by the loudspeaker HP.

The same dual mode terminal shown in the figure is also able to communicate via another radio communication system such as the GSM. Apart from the fact that the encoding and formatting arrangements are adapted to this different system in the modulator MOD, demodulator DEMOD, coder/decoder CODEC, different local oscillator signals must be provided for transmitting and receiving the radio signals of the other system.

To this end, the terminal shown comprises, downstream of said tunable source SYN, a switchable frequency changer DIV so that, the source being able to respond directly to the requirements of one radio communication system, as just explained, the insertion of said frequency changer renders it capable of responding to the requirements of another radio communication system, by virtue of a particular change to the frequency produced by said tunable source SYN brought about by said frequency changer DIV.

In the example described, the frequency changer divides the frequency produced by the synthesizer SYN by a particular factor, here equal to 2. It is therefore a simple frequency divider stage, such as a type D flip-flop, connected to the output of the synthesizer SYN and the output OL' of which provides the required GSM local oscillator signal.

The GSM system uses the frequency bands 890–915 MHz and 935–960 MHz, i.e. the overall frequency band 890–960 MHz.

Using the single tunable source (the synthesizer SYN), the invention provides frequencies in the band 1780–1920 MHz which are divided by 2 by the divider DIV to produce the frequencies needed for the frequency band 890–960 MHz. More generally, the invention produces in the synthesizer SYN frequencies of a band substantially in concordance with that provided directly by the synthesizer and changes these frequencies by an operation such as division, multiplication, addition or subtraction (simple circuits are available to carry out these four operations) to obtain the frequencies of another frequency band, or of a plurality of other frequency bands, in a multimode terminal. Switching means (CEI, CEQ, CRI, CRQ in this example) select the various frequency bands.

To be more precise, in the example described, the terminal is set to GSM transmission by the control device CDE which places the two transmission switches CEI and CEQ in a position such that the output OL' of the divider DIV connected to a GSM transmit phase-shifter DPH2 supplies a 0° phase-shift GSM transmit local oscillator signal to the first transmit mixer MEI and a phase quadrature GSM transmit local oscillator signal to the second transmit mixer MEQ. Transmission then takes place as previously described, but in the GSM system. It is sufficient for the synthesizer SYN, under the control of the control device CDE, to provide at its output OL a frequency twice that which the required GSM channel is to carry.

In an entirely similar way, a GSM receive phase-shifter DPH4 receiving a local oscillator signal OL' from the divider DIV connected to the receive mixers MRI and MRQ by the switches CRI and CRQ enables reception of GSM signals.

There is claimed:

1. A multimode radio communication terminal including only a single tunable source of transmit and receive local oscillator signals for transmitting and receiving channels of at least two different frequency bands in at least first and second radio communication systems, respectively said terminal comprising:

a switchable frequency changer, downstream of said tunable source, for effecting a fixed frequency change, wherein the frequency changer is selectively insertable via a switch so that, upon said tunable source responding directly to the frequency band requirements of only said first radio communication system, insertion of said frequency changer only by operation of said switch renders the terminal capable of responding to the frequency band requirements of only said second radio communication system by virtue of said fixed change, to the frequency produced by said tunable source, effected by said frequency changer, so that said tunable source directly supplies via said switch first local oscillator signals only for the channels of the frequency band in said first radio communication system, so that said frequency changer supplies via said switch second local oscillator signals, of the changed frequency, only for the channels of the frequency band in said second radio communication system, and so that said first and second local oscillator signals are supplied only on a mutually exclusive basis.

2. The multimode radio communication terminal claimed in claim 1, wherein said frequency changer effects a division by a particular factor.

3. The multimode radio communication terminal claimed in claim 2, wherein said factor is 2.

4. A multimode radio communication terminal including a tunable source of transmit and receive local oscillator signals for transmitting and receiving channels of different frequency bands in at least two radio communication systems, said terminal comprising:

a switchable frequency changer, downstream of said tunable source, for effecting a fixed frequency change, wherein the frequency changer is selectively insertable so that upon said tunable source responding directly to the requirements of one radio communication system, insertion of said frequency changer renders the terminal capable of responding to the requirements of another radio communication system using different frequency bands, by virtue of a particular change to the frequency produced by said tunable source effected by said frequency changer;

wherein outputs of said tunable source and of said frequency changer are each followed by a phase-shifter producing two signals phase-shifted 90° with respect to one another for modulating/demodulating signals of two radio communication systems which use quadrature modulation.

5. The multimode radio communication terminal claimed in claim 4, wherein only two mixers are provided for demodulating receive signals of said two radio communication systems, said two mixers receiving, from one or the other of two of said phase-shifters, signals phase-shifted 90° with respect to one another.

6. The multimode radio communication terminal claimed in claim 4, wherein only two mixers are provided for modulating transmit signals of said two radio communication systems, said two mixers receiving, from one or the other of two of said phase-shifters, signals phase-shifted 90° with respect to one another.

* * * * *